United States Patent [19]

Matsukawa

[11] Patent Number: 5,274,586
[45] Date of Patent: Dec. 28, 1993

[54] SEMICONDUCTOR DEVICE HAVING A CAPACITOR DIELECTRIC FILM OF MULTILAYER STRUCTURE AND A METHOD OF CONTROLLING THE SAME

[75] Inventor: Takayuki Matsukawa, Hyogo, Japan

[73] Assignee: Mitsubishi Denki Kabushiki Kaisha, Tokyo, Japan

[21] Appl. No.: 777,973

[22] Filed: Oct. 17, 1991

[30] Foreign Application Priority Data

Oct. 18, 1990 [JP] Japan .................... 2-280874
Apr. 18, 1991 [JP] Japan .................... 3-86605

[51] Int. Cl.$^5$ .................. H01L 27/10; H01L 27/04; G11C 11/34
[52] U.S. Cl. .................. 365/149; 365/185; 257/68; 257/71
[58] Field of Search ............. 365/149, 185

[56] References Cited

U.S. PATENT DOCUMENTS

| | | |
|---|---|---|
| 4,240,092 | 12/1980 | Kuo . |
| 4,423,490 | 12/1983 | Roesner .................. 365/149 |
| 4,542,481 | 9/1985 | Lange .................. 365/149 |
| 4,638,460 | 1/1987 | Matsumoto .................. 365/149 |
| 4,922,312 | 5/1990 | Coleman et al. . |

FOREIGN PATENT DOCUMENTS

| | | |
|---|---|---|
| 3330046A1 | 3/1984 | Fed. Rep. of Germany . |
| 57-23261 | 2/1982 | Japan . |
| 60-50065 | 11/1985 | Japan . |
| 1-261860 | 10/1989 | Japan . |

OTHER PUBLICATIONS

Howard, "Dual dielectric capacitor", IBM TDB, vol. 23, No. 3, Aug. 1980, p. 1058.

IEEE Transactions on Electron Devices, vol., No. 9, Sep., 1990 entitled "Promising Storage Capacitor Structure with Thin $Ta_2O_5$ Film for Low-Power High-Density DRAMS's", by Shinriki et al.

"Introduction to MOS LSI Design", Mavor et al., Addison-Wesley Publishing Company, pp. 133–165, 1983.

Primary Examiner—Eugene R. LaRoche
Assistant Examiner—Viet Q. Nguyen
Attorney, Agent, or Firm—Lowe, Price, LeBlanc & Becker

[57] ABSTRACT

A MOS type semiconductor memory device and a method of controlling the same device that can improve the lifetime (reliability) of a capacitor dielectric film is disclosed. In accordance with the MOS type semiconductor memory device, the cell plate (upper electrode 9) voltage $V_{GG}$ of the capacitor is set to be greater than zero and less than an arithmetic average of the maximum logic voltage $V_H$ and the minimum logic voltage $V_L$ applied to the storage node. The lifetime of the capacitor dielectric film is improved in comparison with a cell plate voltage of $V_H/2$ when an ON (Oxidized Nitride) film is used as a capacitor dielectric film.

23 Claims, 15 Drawing Sheets

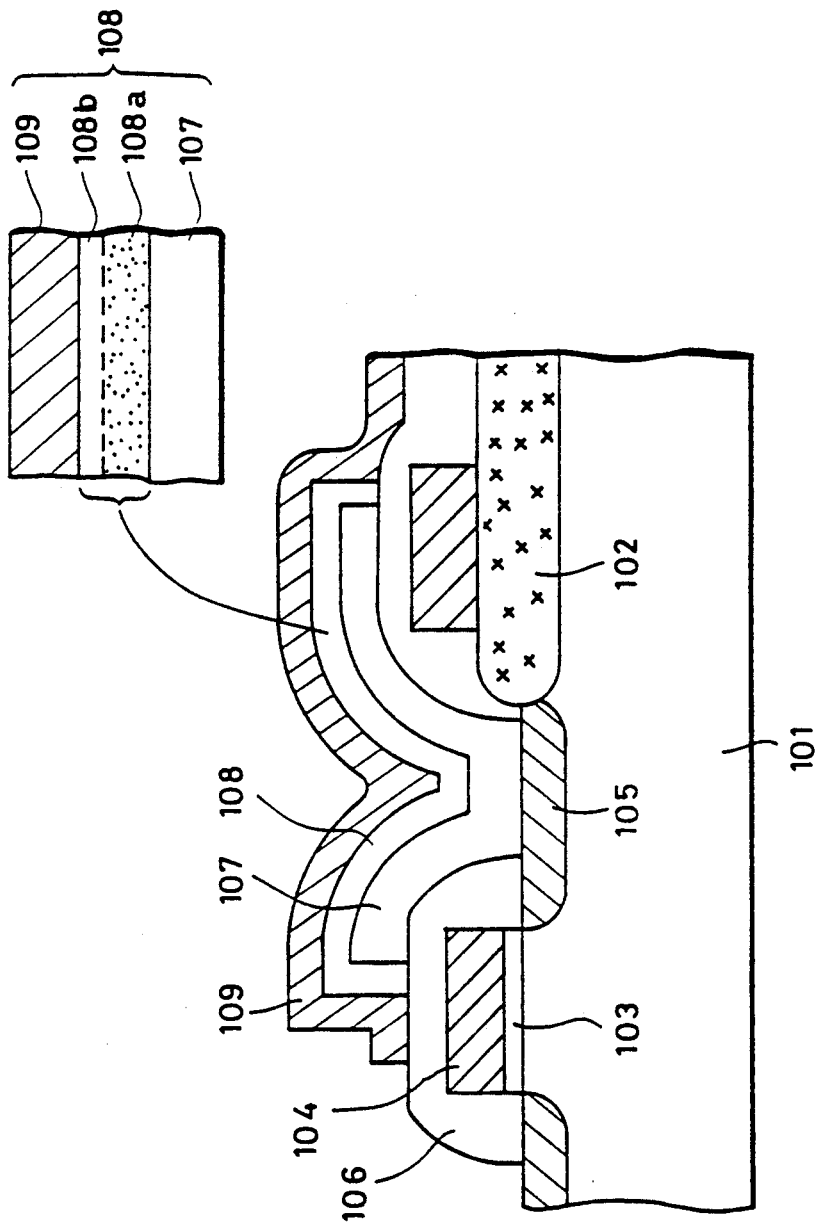

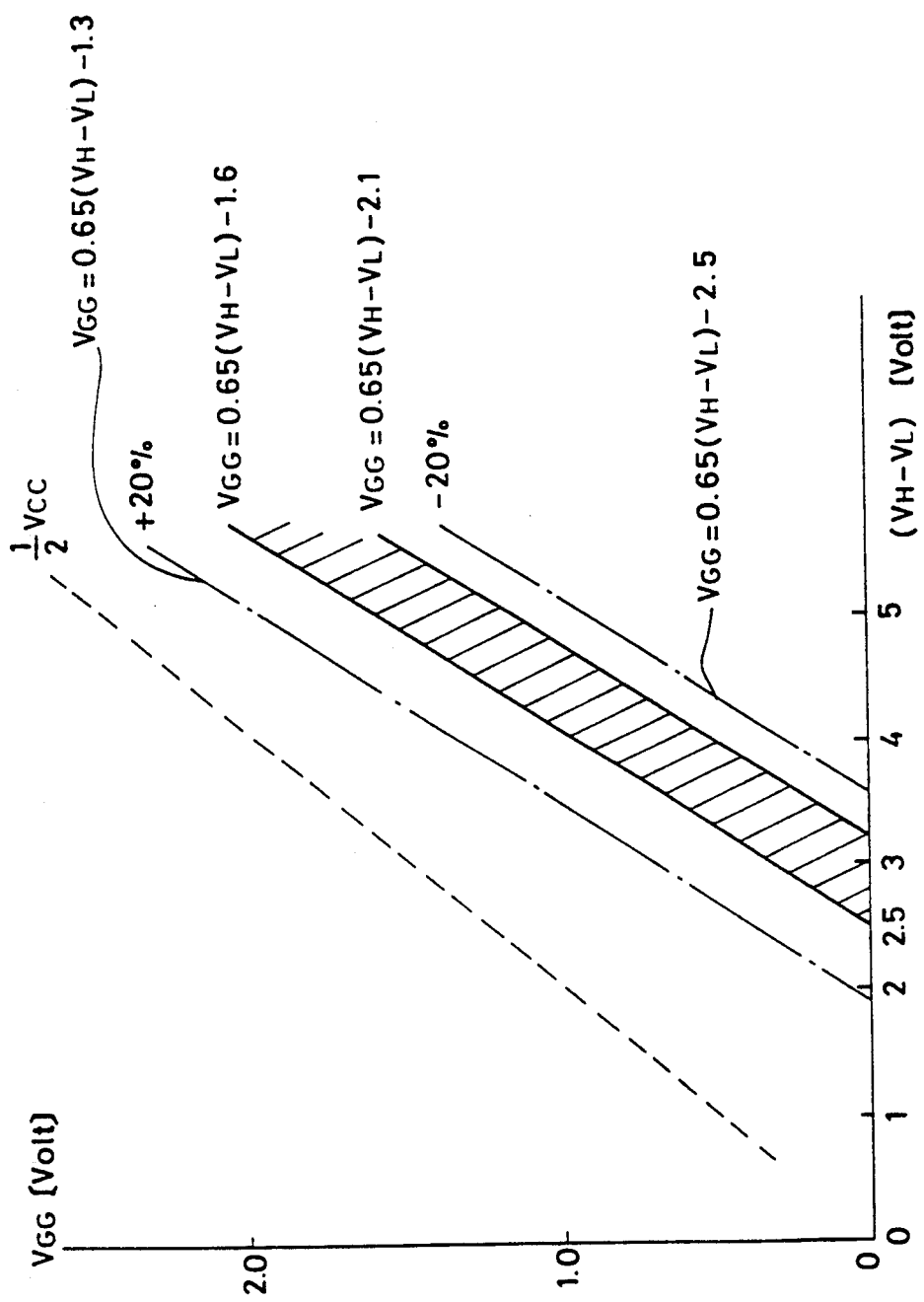

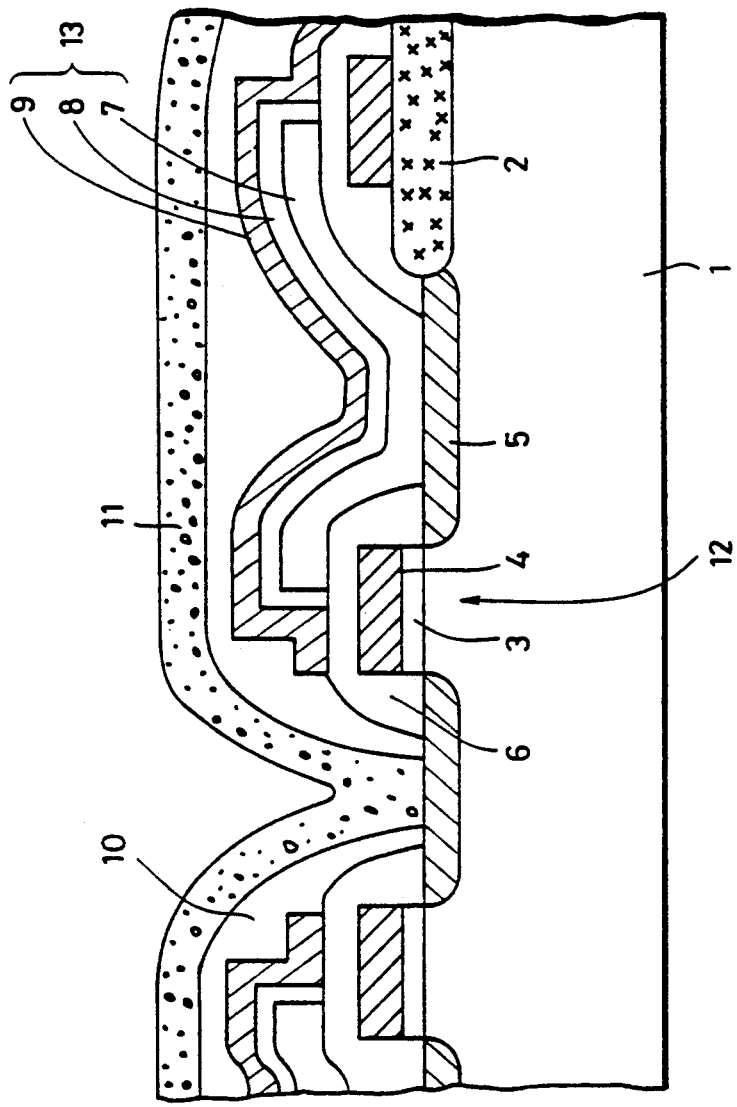

$$0.65(V_H-V_L)-1.3 \geq V_{GG} \geq 0.65(V_H-V_L)-2.5$$

SEMICONDUCTOR DEVICE HAVING A CAPACITOR DIELECTRIC FILM OF MULTILAYER STRUCTURE AND A METHOD OF CONTROLLING THE SAME

BACKGROUND OF THE INVENTION

1. Field of the Invention

The present invention relates generally to a semiconductor device and a method of controlling the same, and more particularly, to a memory cell of a DRAM (Dynamic Random Access Memory) and a method of controlling the same.

2. Description of the Background Art

In recent years, the demand for semiconductor memory devices is rapidly increasing due to the remarkable spread of information processing apparatus such as computers. Semiconductor memory devices having functionally large scaled storage capacity and capable of high spread operation are required. Accordingly, developments in technique are carried out regarding high density integration, quick response, and high reliability of the semiconductor memory devices.

A DRAM is well known as a semiconductor memory device being capable of random input/output of storage information. A DRAM usually comprises a memory cell array including a storage region for storing a plurality of storage information, and a peripheral circuit required for input from and output to an external source. FIG. 1 is a block diagram showing the structure of a conventional DRAM. Referring to FIG. 1, a DRAM 50 comprises a memory cell array 51 for storing data signal of storage information, a row-and-column address buffer 52 for receiving external address signals to select memory cells each forming a unit storage circuit, a row decoder 53 and a column decoder 54 for specifying a memory cell by decoding the address signal, a sense refresh amplifier 55 for amplifying and reading out the signal stored in the specified memory cell, a data-in buffer 56 and a data-out buffer 57 for data input/output, and a clock generator 58 for generating a clock signal.

The memory cell array 51 occupying a large area on the semiconductor chip has a plurality of memory cells arranged in a matrix manner, each for storing unit storage information. A memory cell is generally constituted by one MOS transistor and one capacitor connected thereto. This memory cell is well known as a one-transistor one-capacitor type memory cell. Such memory cells are widely used for large capacity DRAMs because of its simple structure contributing to the improvement in higher integration density of the memory cell array.

The memory cell of a DRAM can be classified into several types depending on the structure of the capacitor. A stacked type capacitor can have an increased capacitor capacitance by increasing the opposing area between electrodes of the capacitor through extension of the major portion of the capacitor to the gate electrode and over the field isolation film. By virtue of this characteristic, a capacitor capacitance sufficient for a stacked type capacitor can be ensured even when elements are miniaturized due to larger scale integration of the semiconductor device. The extensive usage of stacked type capacitors results from such larger scale integration of the semiconductor devices.

FIG. 2 is a sectional view of a memory cell of a conventional stacked type DRAM shown in U.S. Pat. No. 4,922,312, and Japanese Patent Laying-Open No. 57-23261, for example. Referring to FIG. 2, a conventional memory cell of a DRAM comprises a semiconductor substrate 101, an isolation region (102), an insulating film (103) for an MOS transistor, a gate electrode (word line) 104 for an MOS transistor, an impurity diffusion region 105 having a conductivity type opposite of that of semiconductor substrate 101, an interlayer insulating film 106, a lower electrode 107 of a capacitor electrically connected to diffusion layer 105, a dielectric film 108 for the capacitor, an upper electrode 109 for the capacitor, an interlayer insulating film 110, and a bit line 111 constituted by a conductor electrically connected to the diffusion layer 105 opposite of capacitor electrode 107. The MOS transistor 112 is constituted by a pair of diffusion layers 105, insulating film 103, gate electrode 104 and semiconductor substrate 101. The capacitor 113 is constituted by lower electrode 107, dielectric film 108, and upper electrode 109. This device is classified into a general one-transistor one-capacitor type MOS DRAM. The operation principle thereof as a memory is disclosed in the fifth chapter of "Introduction to MOS LSI Design", by John Mavor, Mervyn Jack, Peter Denyer, Addison-Wesley Publishing Co., for example.

FIG. 3 is an equivalent circuit diagram of a memory cell of a DRAM. Referring to FIG. 3, bit line 111 is a signal input/output line, and word line 104 is a select line. Transfer gate 112 is implemented with a MOS type transistor. The capacitance of capacitor 113 for storing signal charges is $C_S$ (storage capacity). A cell plate 116 is equivalent to upper electrode 109 of capacitor 113. Gate electrode 104 of FIG. 2 is also the gate electrode of the transistor and is extended to serve as word line 104.

The operation of the DRAM as a memory will be explained hereinafter with reference to FIG. 3. Storage is carried out by binary notation in this DRAM, as in other semiconductor memories. That is, two states of "high" and "low" logic levels are implemented for a specific memory cell. Information is stored by determination of each cell being either "H" or "L". The storage of H and L in the DRAM is distinguished by the electrode potential of capacitor 115 (indicated by A in FIG. 3, wherein this point is called the storage node) connected to the transfer gate. It is customary to define the H state and the L state as in the following manner.

H state: the potential of point A is high ($V_H$). Electrons are physically extremely scarce than under a thermal equilibrium state.

L state: the potential at point A is low ($V_L$). The device is normally at 0 V potential.

The absolute value may take any value of V from the standpoint of the memory's operation principle as long as a constant difference is ensured between potential $V_H$ corresponding to a H logic level and potential $V_L$ corresponding to a L logic level. In practice, $V_H$ takes the power supply voltage ($V_{CC}$) of the circuit system controlling the memory cells, and $V_L$ takes the ground voltage ($V_{SS}=0$ V) of the same circuit system.

The storage charge amount $Q_H$ at the H level is expressed by the following equation (1):

$$Q_H = C_S \cdot V_H \qquad \ldots (1)$$

The stored charge amount $Q_L$ at the L level is expressed by the following equation (2):

$$Q_L = C_S \cdot V_L \qquad \ldots (2)$$

The H level and the L level are distinguished by converting the difference of the storage charge amounts $Q = Q_H - Q_L$ to a potential difference and reading it out. A differential amplifier circuit of high sensitivity called a sense amplifier is used for this purpose. The operation thereof is conventionally known, and its description is found in the aforementioned "Introduction to MOS LSI Design".

It is to be noted that potential $V_{GG}$ of cell plate 116 of FIG. 3 does not affect the differential charge stored. This means that $V_{GG}$ may take any value of V as long as it is a constant potential to operate the DRAM.

Accordingly, the power supply voltage $V_{CC}$ of the circuit or the ground voltage $V_{SS}$ was used as $V_{GG}$ in DRAMs of mass production. The area occupied by capacitors in such DRAMs are reduced to increase integration density of DRAMs. On the other hand, the reduction of capacitor capacitance $C_S$ is limited due to the fact that S/N (signal-to-noise ratio) of the circuit must be ensured to prevent malfunction (at least 20 fF is necessary under the present condition). This results in the necessity of reducing the thickness of the dielectric film of the capacitor to increase the capacitance per unit area. That is to say, capacitance $C_S$ of the capacitor is expressed by the following equation (3).

$$C_S = S \cdot \frac{\epsilon_0 \cdot \epsilon}{d} \quad (3)$$

S: Opposing area of capacitor
d: dielectric film thickness
$\epsilon_0$: vacuum permittivity
$\epsilon$: relative permittivity
$\epsilon_0 \cdot \epsilon$: permittivity of dielectric film The idea is to compensate for reduction in opposing area S of the capacitor in equation (3) with decrease of the dielectric film thickness d. However, there was an inconvenience from the standpoint of reliability of the dielectric film due to the increase of electric field strength E exerted on the dielectric film. It is generally known that the mean time to failure (referred to as MTTF hereinafter) of the dielectric film has high correlation with the applied electric field E, as in the following equation (4).

$$MTTF \cdot C \cdot e^{-\alpha \cdot E} \quad (4)$$

E: applied field strength
$\alpha$: field acceleration factor

Approximately 1.5/(MV/cm) was measured for the value of $\alpha$ using $SiO_2$ as the dielectric film. This means that the lifetime of the film (assumed to be $10^n$ seconds) is reduced by n=1.5 as a function of electric field applied to $SiO_2$ increasing 1 MV/cm.

A method to solve the short lifetime of the film is proposed in Japanese Patent Publication No. 60-50065, for example. The approach is to reduce cell plate potential $V_{GG}$ to one half of the logic voltage swing of the memory, which is equivalent to power supply $V_{CC}$ of the circuit in most cases.

FIG. 4 is a sectional view of a planar type DRAM cell proposed in Japanese Patent Publication No. 60-50065. Referring to FIG. 4, the capacitor is implemented with a diffusion layer 205 at the surface of a silicon substrate 201 as one electrode and a cell plate 209 as the other electrode. The interlayer insulating film 217 of the capacitor is formed of $SiO_2$ produced by thermal oxidation of silicon substrate 201. The feature of the invention disclosed in Japanese Patent Publication No. 60-50065 is to reduce the potential of cell plate 209 to one half of the logic voltage swing written in the memory (it is assumed to be $V_{CC}$ here). The obtained advantage is obvious from the values of electric field E applied to the $SiO_2$ film shown in the following Table 1.

TABLE 1

|  | E (High) | E (Low) | Q |
|---|---|---|---|
| $V_{CC}$ Cell Plate | $+V_{CC}/d$ | 0 | $C_S \times V_{CC}$ |
| $V_{SS}$ Cell Plate | 0 | $-V_{CC}/d$ | $C_S \times V_{CC}$ |
| ½ $V_{CC}$ Cell Plate | $+V_{CC}/2d$ | $-V_{CC}/2d$ | $C_S \times V_{CC}$ |

The directions of the electric field (code) are different in the conventionally employed $V_{CC}$ cell plate ($V_{GG}=V_{CC}$) method and $V_{SS}$ cell plate ($V_{GG}=V_{SS}$) method. The absolute value of the electric field strength applied to the insulating film is $V_{CC}/d$. By setting the cell plate potential to ½ of $V_{CC}$, the absolute value of electric field strength is $V_{CC}/2d$ in either case of H storage and L storage, which is one half of that in comparison with $V_{CC}$ and $V_{SS}$ cell plates.

However, the electric field applied time of ½ $V_{CC}$ cell plate is averagely two times of that of $V_{CC}$ and $V_{SS}$ cell plates, assuming that the probability of H being stored and L being stored the same.

The electric field strength reliance of the insulating film's lifetime is great as mentioned before. For example, n=1.5 MV/cm in the case of $SiO_2$. It is advantageous from the standpoint of reliability to reduce the electric field to one half even if the time is doubled. It should be noted that the purpose of employing a ½ $V_{CC}$ cell plate is to equal the absolute values of the electric field applied to the capacitor dielectric film, such as $+V_{CC}/2d$ at the time of E (High) and $-V_{CC}/2d$ at the time of E (Low). (Although there may be slight deviation due to fluctuation of the cell plate potential generating circuit, the target is ½ $V_{CC}$.) This is based on the fact that the lifetime of the insulating film is the same regardless of whether the electric field of the capacitor is positive (cell plate side is high potential) or negative (storage node, the A side in FIG. 3 is high potential).

FIG. 4 shows a structure of a cell around the time when Japanese Patent Publication No. 60-50065 was filed. That is to say, a silicon substrate is one electrode of the capacitor, whereby the surface thereof is thermally oxidized to a $SiO_2$ capacitor insulating film. The lifetime of the insulating film depends only on the magnitude of the absolute value of the electric field regardless of the direction of the electric field. It has been confirmed by experiment that the field acceleration factor o is approximately 1.5/ (MV/cm).

The area occupied by one cell is further reduced according to the DRAM scaled to higher densities. The area that can be used for capacitors is reduced significantly in cells having structures shown in FIG. 4. Therefore, a cell structure of a stacked type shown in FIG. 2 has been employed for the structure of capacitors. Such capacitors are implemented with two conductive thin films as an upper electrode 109 and a lower electrode 107, with a dielectric film 108 therebetween. Lower electrode 107 corresponds to the storage node of A of FIG. 3. The storage node is patterned as separate cells with the lower portion thereof electrically connected to diffusion layer 105, where signal charge is input/output.

The upper electrode 109 is electrically, and in most cases physically, connected to a plurality of cells as a cell plate, wherein the entire cell plate is held at a constant cell plate potential $V_{GG}$.

It is shown in FIG. 2 that storage node electrode 107 extends above transfer gate electrode 104 and isolation region 102 to expand the effective area as a capacitor. Upper and lower electrodes 109 and 107 are formed of polysilicon film or the like where resistance value is reduced by being contaminated with impurities such as phosphorus and arsenic. Such polysilicon films are normally formed by low pressure CVD method, in which impurities are introduced at the time of or after CVD film formation.

When the lower electrode is of polysilicon and a capacitor insulating film 108 is to be formed thereabove, the thermal oxidation method described in association with FIG. 4 may of course be adopted. It has become obvious from experiments that reliability of the generated $SiO_2$ is extremely inferior because the polysilicon film is oxidized. The cause may be due to the generation of weak spots of low reliability scattered in the thermal oxidized film resulting from significant polycrystal grain boundary migration of the underlying polysilicon during oxidization. Therefore, insulating films formed by CVD method are mainly used for stacked type capacitor structures as of FIG. 2.

Any material may be selected for the formation of the film, regardless of the underlying material if the capacitor insulating film is formed by the CVD method. A silicon nitride film ($Si_3N_4$) is often used because the permittivity thereof is about two times of that of $SiO_2$, whereby the capacitor capacitance $C_S$ indicated in the aforementioned equation (3) can be ensured. However, leak current through the entire film is great when a $Si_3N_4$ film formed by CVD method is used solely as a capacitor dielectric film. Therefore, $Si_3N_4$ film formation is generally followed by oxidation of the surface thereof under oxidizing high temperature atmosphere to form a structure of an ON (Oxidized Nitride) film.

FIG. 5 is a sectional structure view for explaining in detail the capacitor dielectric film of the stacked type DRAM cell of FIG. 2. Referring to FIG. 5, a capacitor dielectric film 108 comprises a $Si_3N_4$ film 108a deposited by CVD, and a $SiO_2$ film 108b formed by oxidizing $Si_3N_4$ film 108a. There is a very thin $SiO_2$ layer (not shown) at the boundary of underlying polysilicon (lower electrode 107) and CVD deposited $Si_3N_4$ film 108a. This thin layer is formed due to the polysilicon surface being slightly thermal oxidized before the film is deposited in forming $Si_3N_4$ film 108a by CVD method over the polysilicon (lower electrode 107) at a temperature of not less than approximately 700° C. The thickness of the $SiO_2$ layer is estimated to be not more than approximately 0.5 nm in a low pressure CVD device.

The cell plate potential has also employed the $\frac{1}{2} V_{CC}$ in the stacked type DRAM cells of FIGS. 2 and 5. This is because the feature of the reliability of the $SiO_2$ type ON film was not clearly comprehended. The customarily employment of $\frac{1}{2} V_{CC}$ is only the result of conventional selection.

The above mentioned ON film is applicable to not only a stacked type capacitor such as of FIG. 2, but also to a trench type capacitor having a capacitor electrode formed in an excavated groove in a substrate. Most existing DRAMs with trench type capacitors employ a similar ON film and the $\frac{1}{2} V_{CC}$ cell plate method.

In conventional MOS type DRAMs, the cell plate voltage was set to $\frac{1}{2} V_{CC}$ to minimize the electric field within the dielectric film when thermal oxidized $SiO_2$ films are used as dielectrics, as mentioned before. Then, a cell structure of the stacked type or the trench type was employed for the purpose of expanding the effective area of the capacitor. In order to avoid the influence of polycrystal grain boundary migration in such cases, an ON film was used as a dielectric film formed mainly of $Si_3N_4$ deposited by CVD.

The aforementioned selection of $\frac{1}{2} V_{CC}$ for $V_{GG}$ had the following grounds. That is, the reliability of the dielectric film is irrespective of the direction of the electric field applied to the capacitor electrode, as in the case where a silicon thermal oxide film is formed over a monocrystal silicon. There was also the physical fact that the effect of electric field reduction is more advantageous than the effect of the field application time upon the lifetime from the standpoint of reliability.

The ON film used in capacitors of the stacked type or the trench type with a two layer structure (a three layer structure to be exact) of oxide film/nitride film is asymmetric in the direction of film thickness. Therefore, there is possibility that the above mentioned conditions do not apply. Nevertheless, a $\frac{1}{2} V_{CC}$ cell plate was employed in DRAMs of the conventional stacked type or trench type capacitors. Accordingly, there was a disadvantage that degradation is seen at a time period significantly shorter than the normal lifetime of the capacitor dielectric film.

SUMMARY OF THE INVENTION

An object of the present invention is to improve the lifetime of a capacitor dielectric film used in a semiconductor device.

Another object of the present invention is to improve the reliability of a DRAM memory cell.

A further object of the present invention is to improve reliability of a capacitor dielectric film formed of an ON (Oxidized Nitride) film in a method of controlling a semiconductor device.

According to an aspect of the present invention, a semiconductor device includes a capacitor and a fixed voltage generator. The capacitor stores high logic voltage $V_H$ and low logic voltage $V_L$. The capacitor includes first and second electrodes arranged opposing each other and a multilayer dielectric film formed between the two electrodes. A logic voltage is applied to the first electrode. The fixed voltage generator is connected to the second electrode of the capacitor. The second electrode is applied with a fixed voltage greater than 0 and less than an arithmetic average of high logic voltage $V_H$ and low logic voltage $V_L$.

In operation, a fixed voltage greater than 0 and less than an arithmetic average of high logic voltage $V_H$ and low logic voltage $V_L$ is applied from the fixed voltage generator to the second electrode of the capacitor. Therefore, a fixed voltage suitable to the lifetime characteristic of the multilayer dielectric film is applied to the second electrode to improve significantly the lifetime of the capacitor dielectric film.

According to another aspect of the present invention, a method of controlling a semiconductor device applies alternately high logic voltage $V_H$ and low logic voltage $V_L$ to the first electrode, and applies a fixed voltage $V_{GG}$ greater than 0 and lower than an arithmetic average of high logic voltage $V_H$ and low logic voltage $V_L$ to a second electrode at the time of operation.

In operation, high logic voltage $V_H$ and low logic voltage $V_L$ are alternately applied to the first electrode, and a fixed voltage set greater than 0 and less than the arithmetic average of high logic voltage $V_H$ and low logic voltage $V_L$ is applied to the second electrode. Therefore, a fixed voltage suitable to the lifetime characteristic of the multilayer dielectric film is applied to the second electrode to improve the lifetime of the capacitor dielectric film.

BRIEF DESCRIPTION OF THE DRAWINGS

FIG. 5 is a sectional structure view for explaining in details a capacitor dielectric film of the stacked type DRAM of FIG. 1.

FIG. 8 is a graph indicating the allowable range of cell plate voltage $V_{GG}$ of the capacitor of the present invention.

FIGS. 9A-9G are sectional structure views for explaining the manufacturing process of a memory cell of a stacked type DRAM according to an embodiment of the present invention.

DESCRIPTION OF THE PREFERRED EMBODIMENTS

The insulating film of a DRAM should have a lifetime of $9.5 \times 10^8$ seconds (30 years) to be regarded substantially as semi-permanent. In practice, it is very difficult to actually measure whether the lifetime is really such as the above mentioned lifetime. This lifetime is normally tested by some acceleration degradation test. Regarding the reliability of a dielectric film, degradation of the dielectric film is greatly accelerated by the applied electric field strength, as shown in the aforementioned equation (4). The method of accelerating degradation is carried out by applying a voltage higher than the actually used voltage to the dielectric film. The lifetime at the time of low electric field can be estimated extremely precisely even if estimation is carried out by a voltage higher than the actual usage condition, as long as equation (4) is valid.

Figure 6A:
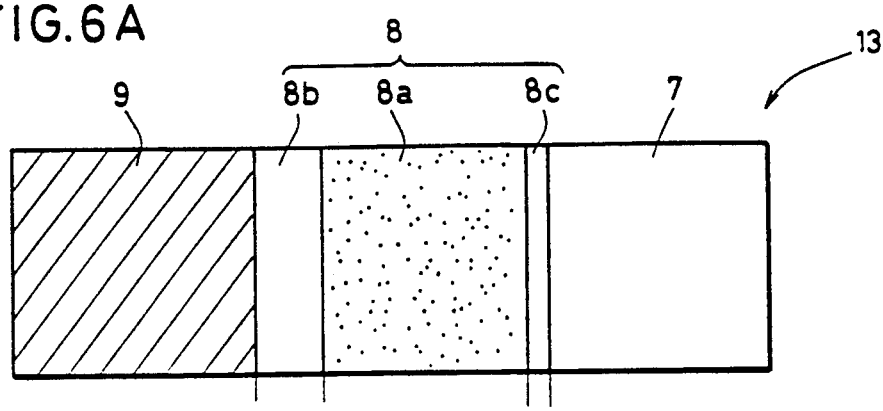
FIG. 6A is a sectional view showing schematically the structure of a capacitor for explaining the feature of the present invention.
Figure 6B:
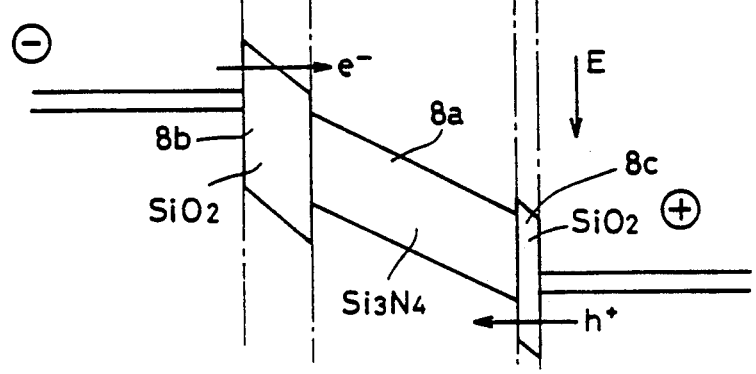
FIGS. 6B and 6C are energy diagrams of the capacitor of FIG. 6A.
Figure 6C:
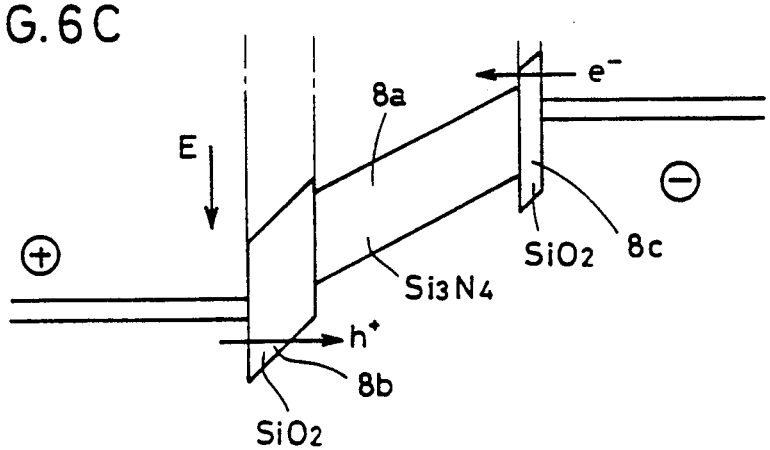

The embodiments of the present invention will be explained hereinafter with reference to the drawings. Referring to FIGS. 6A-6C, an oxide film layer 8c is generated in forming a silicon nitride film 8a by CVD over a polysilicon layer 7 implementing a storage node. In other words, oxide film layer 8c is generated by polysilicon layer 7 being oxidized by oxygen remaining in the CVD chamber, before formation of silicon nitride film 8a. As a result, the actual ON film has a three layer structure of oxide film/nitride film/oxide film as shown in FIGS. 6A-6C. It is appreciated from FIGS. 6B and 6C that $\epsilon_0 \cdot \epsilon \cdot E$ ($\epsilon_0$: vacuum permittivity, $\epsilon$: relative permittivity, E: electric field strength) are held constant by Gauss theorem regarding the electric field strength in the three layer film. The slant of the band represents the electric field strength in the band diagrams of FIGS. 6B and 6C. As a result, the electric field strength is reduced in $Si_3N_4$ having high permittivity (approximately two times of that of $SiO_2$, $\epsilon = 7.6$) to approximately one half of the slant of $SiO_2$. High field strength is applied to such a film, wherein holes and electrons are respectively tunnel-implanted from the positive and negative electrodes. These holes and electrons defect the internal of the insulating film to trap charges. The implantation of these holes and electrons is accelerated when the local electric field generated by these traps exceed a critical level. This results in the destruction of the insulating film. The above description is a model of insulating film destruction.

The following conclusions are based on experimental results regarding the reliability of a capacitor using polycrystal silicon for both upper and lower capacitor electrodes with a three layered structure of (i) oxide film, (ii) nitride film, (iii) oxide film as that shown in FIG. 6A.

(i) The lower oxide film 8c should be as thin as possible. It is assumed that the crystal grain boundary migration of the polysilicon in oxidation causes non uniformity in the oxide film reliability. The thickness of the lower oxide film can be reduced to the degree of 0.5 nm with existing CVD devices.

(ii) The upper oxide film 8b serves to control leak current within the insulating film, whereby leak current of the entire film depends on the number of the passing carriers. The thickness of the upper oxide film 8b must take a value represented in the following equation (5) to ensure sufficient refresh time of the DRAM.

$$\text{Upper Oxide Film Thickness (nm)} \geq 3/5 \quad V_H(\text{nm/Volt}) \qquad \ldots (5)$$

Figure 7:
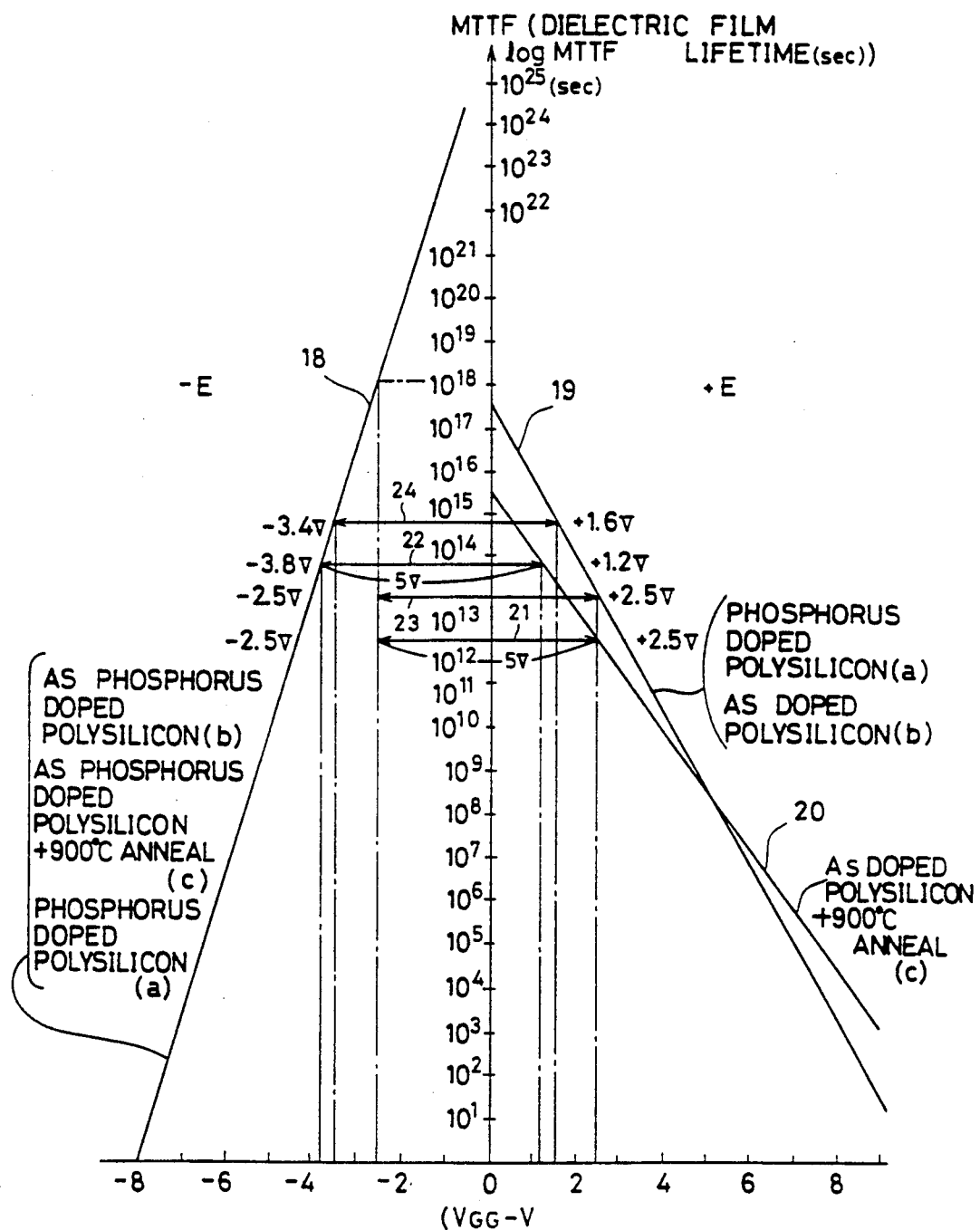
FIG. 7 is a graph indicating the measured data of the dielectric film lifetime which is the basis of the present invention.

Experiments were carried out with the upper and lower electrodes formed of polysilicon. A plurality of capacitors were formed therebetween using the above mentioned ON film as a dielectric film. The lifetime of this insulating film was measured altering the voltages applied between both electrodes. The results are shown in FIG. 7. The thickness of the dielectric film is upper $SiO_2$/intermediate $Si_3N_4$/lower $SiO_2 = 3$ nm/8 nm/0.5 nm. If all the dielectric film thickness is assumed to be $SiO_2$, the capacitor is equivalent to a $SiO_2$ film of 7.5 nm. A change in film thickness will not affect the following conclusion because the resulting straight line relationship is the same, i.e. the slant of the straight line is the same. Regarding the measurement of the experiments, the following three methods were used to introduce impurities into the underlying electrode 7 of polysilicon.

(a) Phosphorus doped polysilicon having phosphorus of above $10^{20} cm^{-3}$ simultaneously doped during CVD (b) Polysilicon ion implanted with arsenic of above $10^{19} cm^{-3}$ after CVD polysilicon formation (c) Polysilicon annealed for 30 minutes at 900° C. in nitride atmosphere to activate arsenic in advance, after formation of film (b)

A capacitor was generated by forming the above mentioned dielectric film over these three types of polysilicon. The MTTF of the capacitor was measured changing the voltage ($V_{GG}-V_{Store}$) applied between the electrodes, resulting in the values indicated in FIG. 7. Referring to FIG. 7, it has been found that electric field reliance tends to have a slight gentle curve in regions where the applied voltages have an absolute value exceeding 8 V. However, in the region indicated by this figure, log MTTF and ($V_{GG}-V_{Store}$) have a linear relationship, where the field reliance shown in the aforementioned equation (4) is maintained.

Line 18 is a lifetime estimation line where the side of the upper electrode 9 is negative, in which all polysilicon formed by methods (a), (b) and (c) have almost no difference and lie on the same straight line. Line 19 is the lifetime estimation line where upper electrode 9 is positive, in which polysilicon is formed by method (a) or (b). Line 20 is a lifetime estimation line where upper electrode 9 is positive, in which polysilicon is formed by method (c).

It is appreciated that reliability of ON film (lifetime) on polysilicon is asymmetric to the direction of the electric field applied to the film, having a shorter lifetime with a positive potential applied to the upper electrode 9. This can be described with reference to FIGS. 6A–6C. Referring to FIG. 6B, current flowing through the film is dominated by electrons tunneling through the upper oxide film 8b when upper electrode 9 is negative. When upper electrode is positive as in FIG. 6C, current flowing through the upper oxide film is dominated mainly by holes flowing through upper oxide film 8b.

Holes have much greater effect than electrons in damaging the dielectric film (generation of traps). A positive upper electrode 9 degrades the ON film to shorten its lifetime.

It has been found out that the ½ $V_{CC}$ cell plate method in which electric field of the same absolute value of positive and negative applied to the ON film on the polysilicon layer is unfavorable regarding reliability since the lifetime of the dielectric film is asymmetric according to the direction of the electric field. For example, obtain the lifetime from FIG. 7 by applying a voltage according to the ½ $V_{CC}$ cell plate method where $V_{CC}=5$ V to the lifetime estimation line (positive side: lifetime estimation line 20, negative side: lifetime estimation line 18) for the film above polysilicon of method (c). The result is indicated by arrow 21 in FIG. 7. That is to say, the lifetime is $10^{12}$ seconds at the positive side, whereas $10^{18}$ seconds at the negative side. This means that although there is a great allowance in the negative side, lifetime at the positive side is first spent to yield a MTTF of approximately $10^{12}$ seconds for the entire film.

When the voltage of the cell plate (the second capacitor) is lowered to 1.2 V in operating at $V_{CC}=5$ V with the same type of dielectric film and set the voltages applied to the dielectric film to 1.2 V for the positive side and −3.8 V for the negative side, the result is as shown by arrow 22, where the lifetime of the positive and negative sides both expand to approximately $5 \times 10^{13}$ seconds. A longer lifetime of approximately $10^{14}$ seconds can be obtained than in the case of a conventional ½ $V_{CC}$ cell plate ($10^{12}$ seconds).

The above facts also apply in the cases of the aforementioned methods of (a) and (b). (Lifetime estimation lines 18 and 19). The lifetime according to the ½ $V_{CC}$ cell plate is limited to $10^{13}$ seconds as shown by arrow 23 in FIG. 7. By setting the cell plate voltage to 1.6 V and applying voltage of 1.6 V at the positive side and −3.4 V at the negative side to the dielectric film (voltage swing is 5 V), the lifetime is improved to $5 \times 10^{14}$ seconds.

The present invention takes advantage of the fact that the lifetime of the dielectric film of the capacitor electrode is asymmetric by the direction of the electric field to set the voltage $V_{GG}$ of the cell plate (the second capacitor electrode) so that the maximum logic voltage swing applied at the time of the first capacitor electrode operation is divided into unequal voltage values excluding 0 V.

The optimum value for voltage value division of the above unequal division is preferably as in the following equation (7).

The optimum value of $V_{GG}$ obtained as described when the logic voltage swing is 5 V with reference to FIG. 7 is indicated as a general voltage swing ($V_H - V_L$) in FIG. 8.

Referring to FIG. 8, the hatched area indicates the optimum value range of $V_{GG}$ taking various underlying polysilicons (capacitor lower electrode) in consideration. It can be said that the optimum value of $V_{GG}$ should take a value in the range of the following equation (6) where logic voltage swing ($V_H-V_L$) is above 2.5 V according to the results of the experiments (the unit of voltage is volt).

$$0.65(V_H-V_L) - 1.6 \geq V_{GG} \geq 0.65(V_H-V_L) - 2.1 \quad \ldots (6)$$

The above equation is established according to the experiments implemented with the three types of underlying polysilicon (capacitor lower electrode) of (a), (b) and (c) in FIG. 7. Estimating 20% of allowance in the upper and lower limits due to difference of the underlying polysilicon, the maximum value range of $V_{GG}$ is slightly enlarged as in the following equation (7), where the unit is in volts.

$$0.65(V_H-V_L) - 1.3 \geq V_{GG} \geq 0.65(V_H-V_L) - 2.5 \quad \ldots (7)$$

It is also appreciated from FIG. 8 that the reliability of the film improves by setting $V_{GG}$ as 0 V as long as the above mentioned ON film is used as the capacitor dielectric film, in regions where the logic voltage swing ($V_H-V_L$) is not more than 2 V. This is also an important conclusion obtained by the experiments related to the present invention.

Figure 9A:
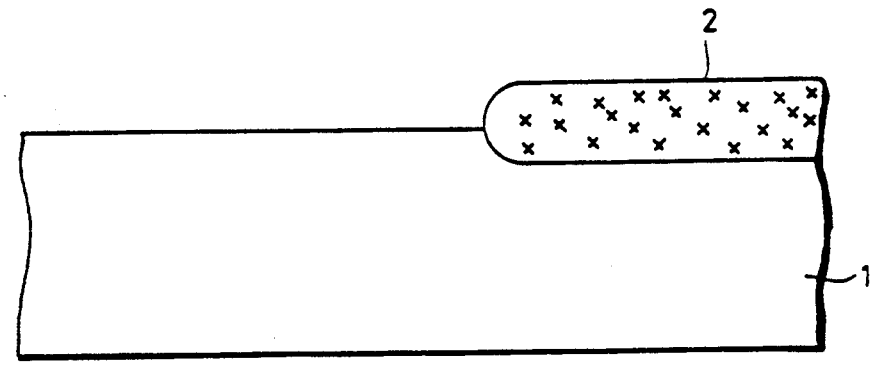
Figure 9B:
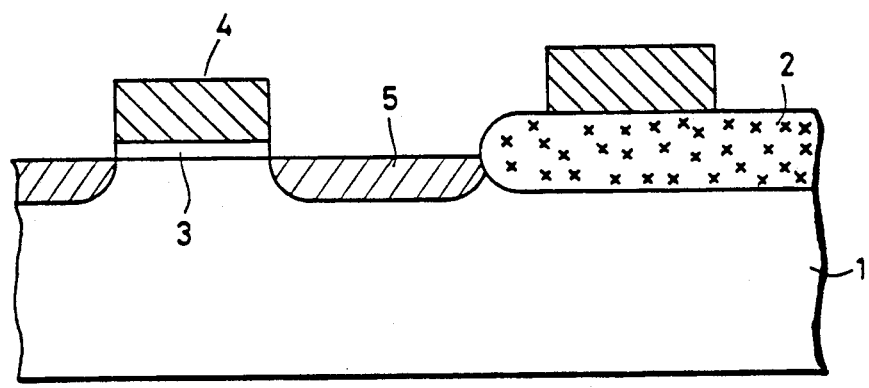

An embodiment of the present invention will be explained according to the above mentioned conclusion. First, a manufacturing process of the embodiment of the present invention will be explained with reference to FIGS. 9A–9G. Referring to FIG. 9A, a thick silicon oxide film ($SiO_2$) layer 2 which serves as an isolation region is selectively formed above a semiconductor substrate 1. Referring to FIG. 9B, the surface of the substrate is oxidized to form a gate oxide film 3 of the MOS transistor, followed by formation of a gate electrode 4. Using this gate electrode as a mask, impurities of a conductivity type opposite to that of substrate 1 are introduced to form an impurity diffusion layer 5. Although polysilicon having permittivity reduced with impurities such as phosphorus is often used as the material of gate electrode 4, silicide such as $WSi_2$ and $MoSi_2$ may also be used.

Figure 9C:
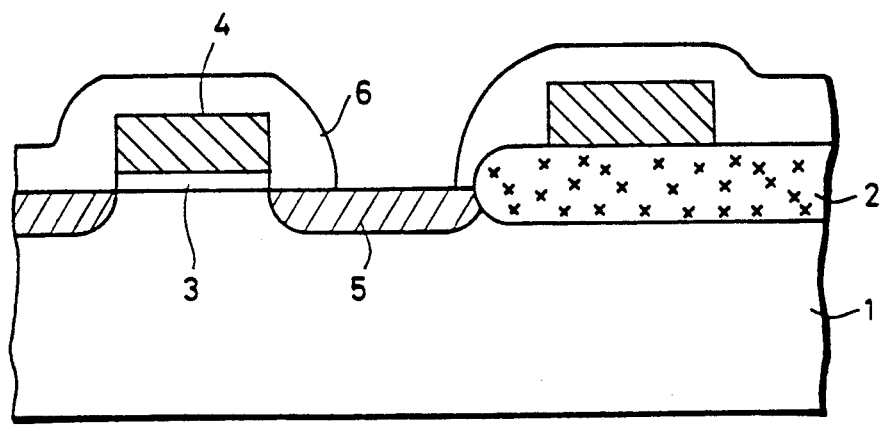

Referring to FIG. 9C, after an interlayer insulating film layer 6 is formed by CVD method all over the surface, anisotropic etching is applied to expose the surface of diffusion layer 5 between the region of the MOS transistor and the isolating region.

Figure 9D:
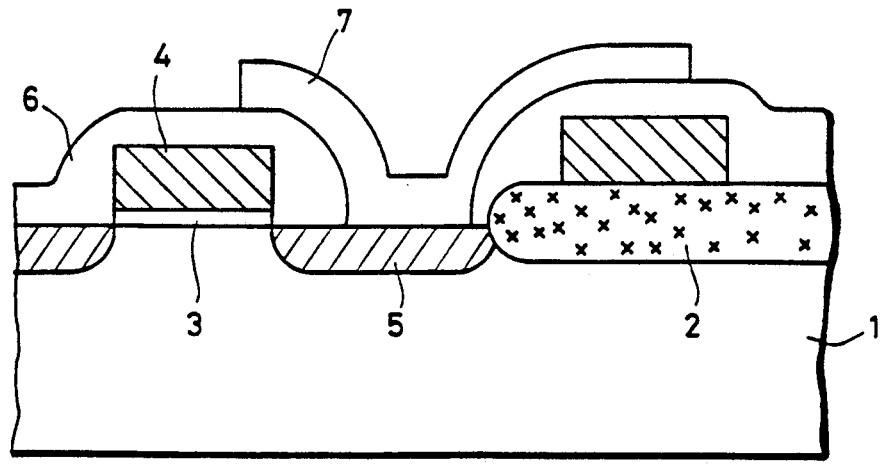

Referring to FIG. 9D, polysilicon for example is deposited thereabove by CVD method. A predetermined configuration is patterned using lithography method to form a lower electrode 7 of the capacitor. The method of forming this lower electrode 7 has important effect upon the reliability of the capacitor. The method of forming polysilicon having favorable results are preferably a phosphorus-doped polysilicon reacting silane ($SiH_4$) with phosphine ($PH_3$) in a low pressure CVD chamber heated to approximately 650° C., or a polysilicon film formed by reaction of only silane in a similar chamber. Arsenic of approximately $3 \times 10^{15} cm^{-2}$ is then implanted by ion implantation method.

Figure 9E:
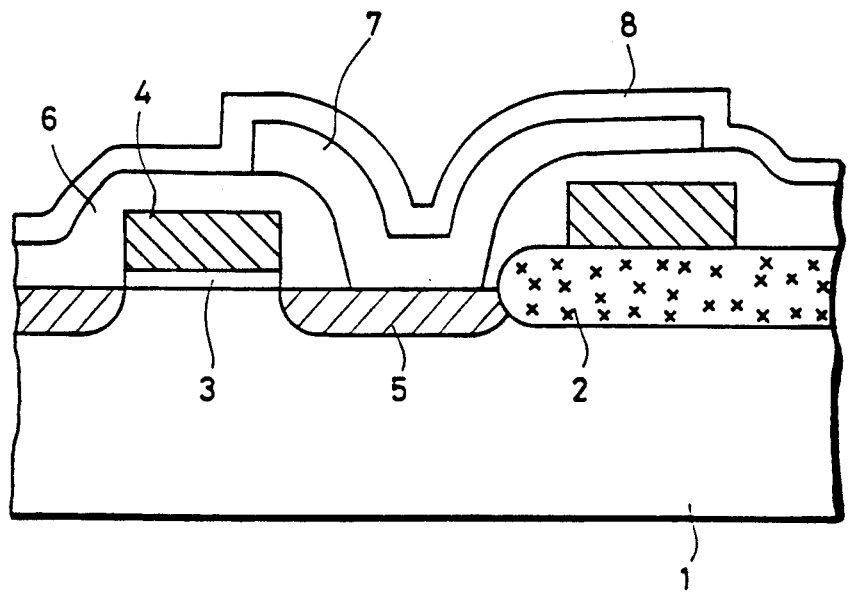
Figure 9F:
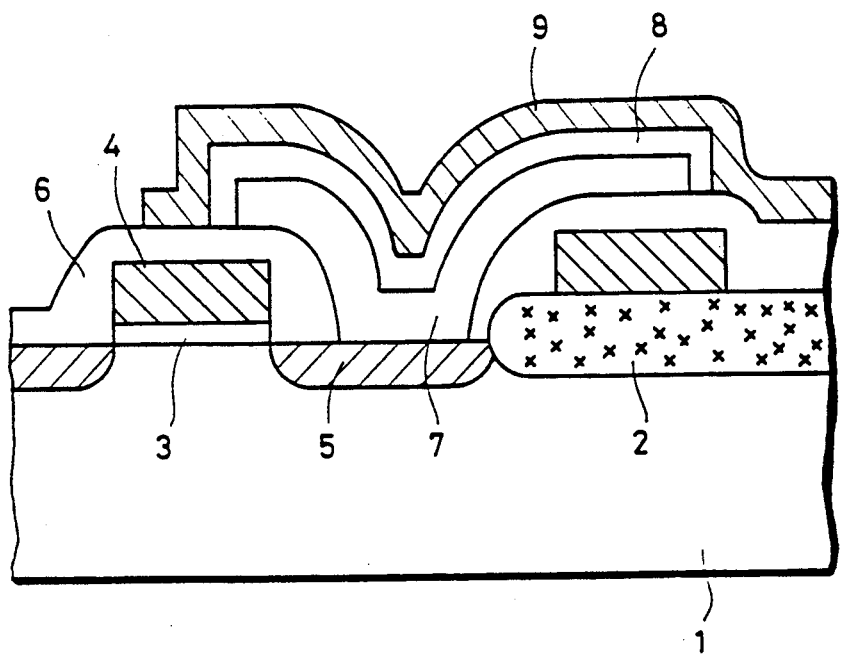

Referring to FIG. 9E, a dielectric film 8 is formed all over the surface. That is to say, first a $Si_3N_4$ film is formed by introducing silane ($SiH_4$) and ammonia ($NH_3$) into a low pressure CVD chamber heated to approximately 720° C.–750° C. This film is then subjected to oxygen or moisture ($H_2O$) atmosphere in an oxide chamber (atmospheric pressure) of 850° C.–900° C. to change the surface to $SiO_2$ from $Si_3N_4$. The resulting film has a three layer structure of $SiO_2/Si_3N_4/SiO_2$, as shown in FIG. 5A. Referring to FIG. 9F, a capacitor upper electrode (9) is deposited so as to completely cover the lower electrode layer by patterning with the normal lithography method and etching method. Although polysilicon doped with phosphorus and arsenic is normally used as the material of capacitor upper electrode layer 9, silicide such as $WSi_2$ and $MoSi_2$ may be used.

Thus a capacitor and a transistor is formed as in the above described manner. Referring to FIG. 9G, an interlayer insulating film 10 is formed wherein a contact hole is formed at a predetermined position up to the surface of diffusion layer 5. A bit line wiring 11 is formed extended in a direction substantially at right angles towards the extending direction of gate electrode 4. Thus, the main elements of the DRAM cell are completed. The MOS transistor 12 is implemented with a pair of diffusion layers 5, a gate oxide film 3, a gate electrode 4, and a semiconductor substrate 1. The capacitor 13 is implemented with a lower electrode 7, a dielectric film 8, and an upper electrode 9.

Although bit line 11 is formed at the final stage in the above embodiment, there is principally no inconvenience in forming bit line 11 prior to capacitor formation.

Figure 10:
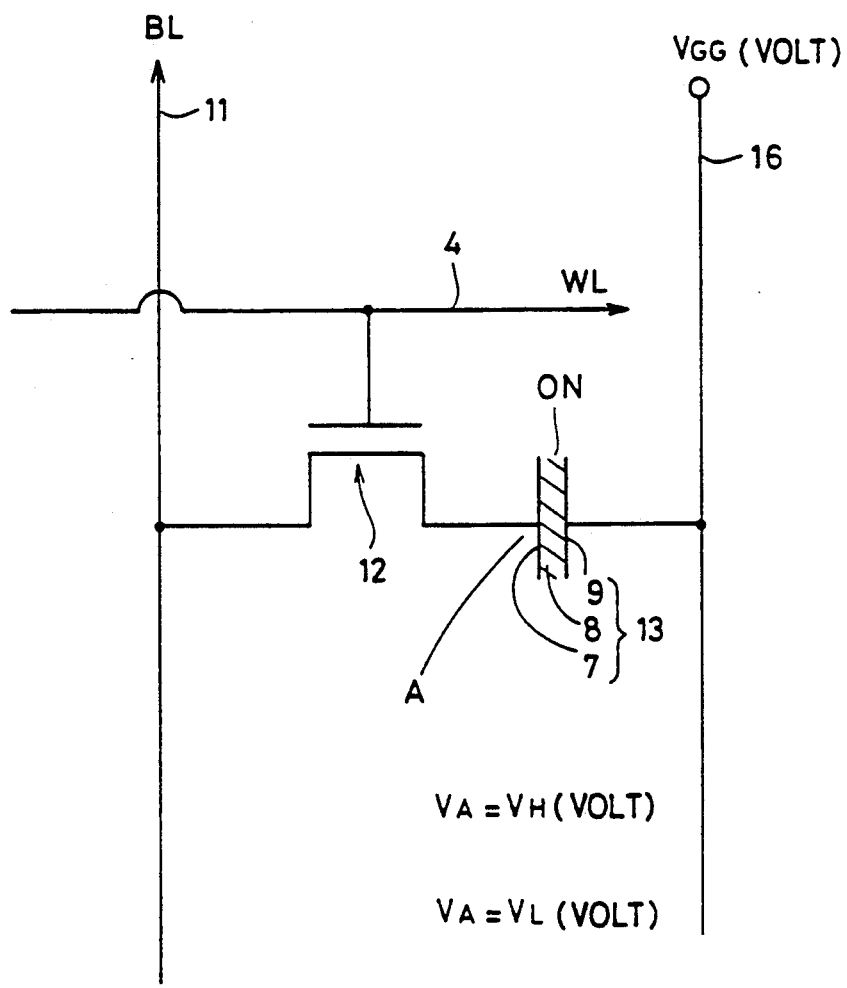
FIG. 10 is an equivalent circuit diagram of a DRAM according to an embodiment of the present invention.

In accordance with the above mentioned steps, a DRAM cell having a stacked type capacitor is formed. The capacitor structure comprises upper and lower electrodes of polysilicon and an interlayer insulating film of three layers of $SiO_2/Si_3N_4/SiO_2$. The circuit diagram of such a DRAM cell is shown in FIG. 10. One electrode of the capacitor connected to $V_{GG}$ is equivalent to the capacitor upper electrode 9 in FIG. 9G. By setting voltage $V_{GG}$ applied to this portion to a specific value in the range of equation (7), the lifetime of the oxidized silicon nitride film can be expanded to more than $n = 1.5$ in comparison with that of a conventional $\frac{1}{2} V_{CC}$ type cell plate potential method.

The setting of $V_{GG}$ to the above mentioned value in the circuit requires only change in division ratio of the power supply voltage $V_{CC}$, and can be implemented easily without a great modification in the circuitry.

Figure 11:
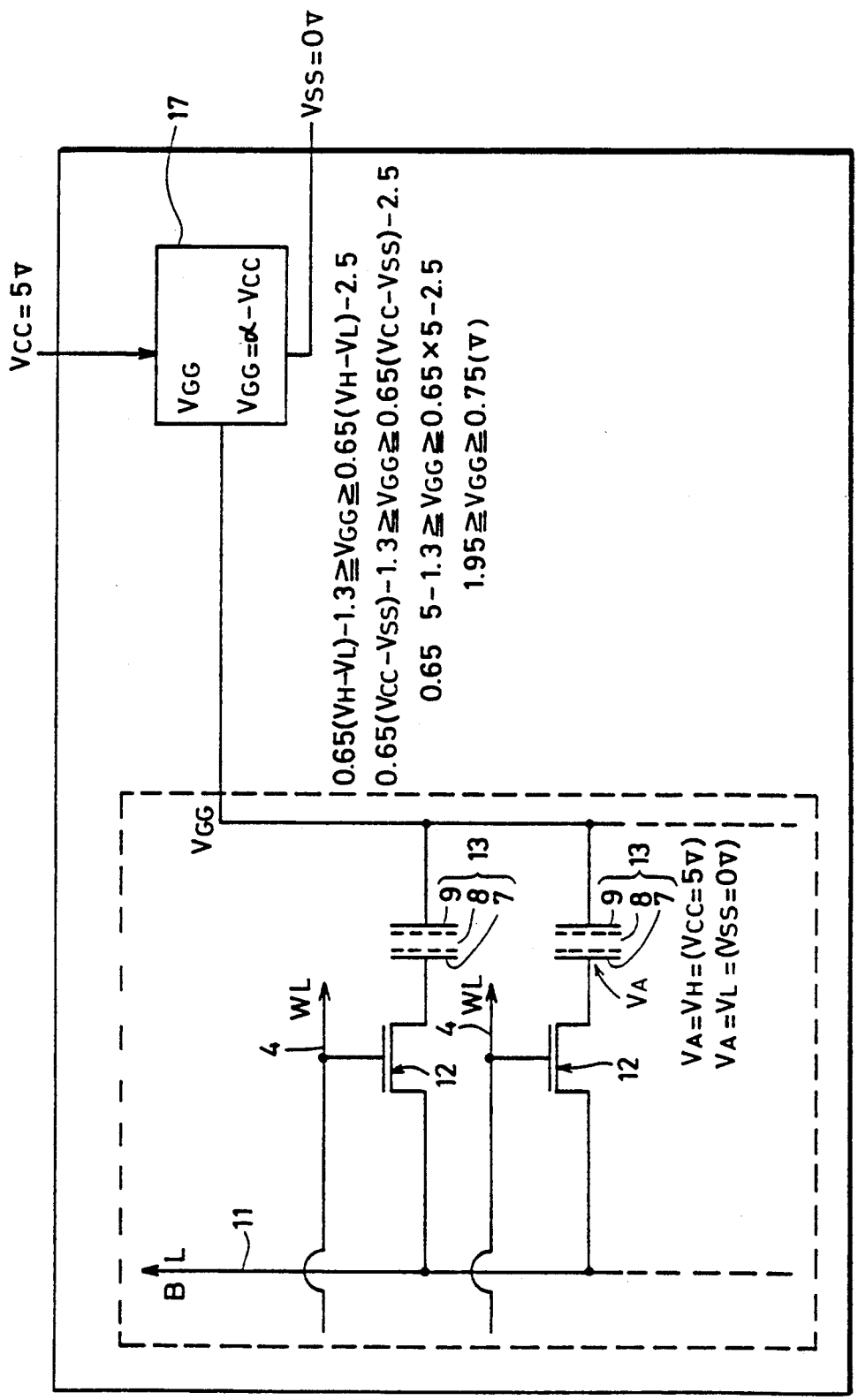
FIG. 11 is a block diagram of a structure of a DRAM comprising a $V_{GG}$ generator according to an embodiment of the present invention.
Figure 12:
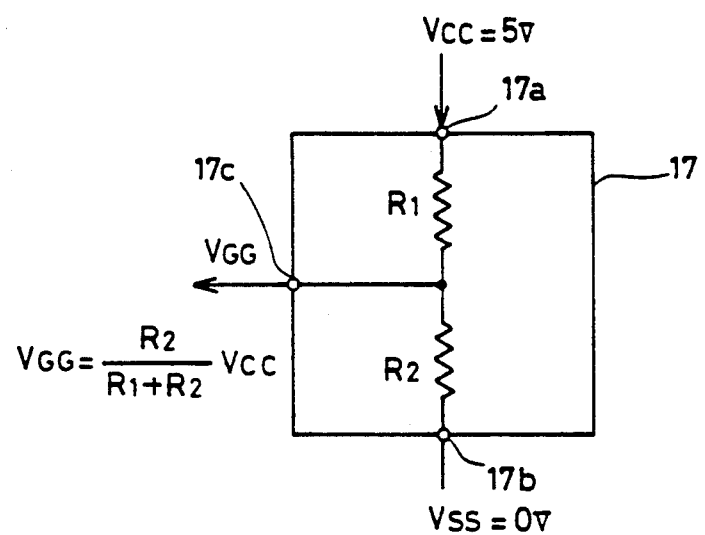
FIG. 12 is a diagram for explaining in detail the $V_{GG}$ generator of FIG. 11.

FIG. 11 is a block diagram of a structure of a DRAM having a $V_{GG}$ generator according to an embodiment of the present invention. Referring to FIG. 11, a plurality of word lines 4 are arranged with a predetermined distance therebetween in a direction crossing bit line 11. One electrode of transfer gate transistor 12 is connected to a predetermined position of bit line 11. The control electrode of transfer gate transistor 12 is connected to word line 4. The other electrode of transfer gate transistor 12 is connected to lower electrode 7 of capacitor 13. Upper electrode 9 of capacitor 13 is connected to $V_{GG}$ generator 17. Supply voltage $V_{CC}$ (5 V) and ground voltage $V_{SS}$ (0 V) are connected to generator 17. $V_{GG}$ is obtained from the equation of (7) indicating the allowable range ($\pm 20\%$) of $V_{GG}$. In the present embodiment, $V_H$ is equivalent to $V_{CC}$, and $V_L$ to $V_{SS}$. $V_{CC}$ is 5 V, and $V_{SS}$ is 0 V. Accordingly, $V_{GG}$ may be set to be within a range of not less than 0.75 V and not more than 1.95 V. Memory operation is carried out by applying a voltage of $V_H$ or $V_L$ to lower electrode 7 of capacitor 13, while applying $V_{GG}$ set within the above mentioned range to upper electrode 9 of capacitor 13. This can lengthen the lifetime of dielectric film 8 of capacitor 13 in comparison with the convention $\frac{1}{2} V_{CC}$ cell plate method. FIG. 12 is a diagram for explaining in detail the $V_{GG}$ generator of FIG. 11. Referring to FIG. 12, resistors R1 and R2 are connected in series between terminal 17a applied with $V_{CC}$ and terminal 17b applied with $V_{SS}$. The connection of resistors R1 and R2 is connected to terminal 17c providing $V_{GG}$. Such a structure allows division of $V_{GG}$ at a predetermined division ratio to easily set $V_{GG}$ to a predetermined value. In the case of such a structure, $V_{GG}$ is expressed by the following equation (8).

$$V_{GG} = \frac{R_2}{R_1 + R_2} V_{CC} \tag{8}$$

The present embodiment is not limited to the described fixed voltage generator 17 dividing $V_{CC}$ using resistors $R_1$ and $R_2$, and may employ a fixed voltage generator setting $V_{GG}$ to a predetermined value without using a resistor.

Figure 1:
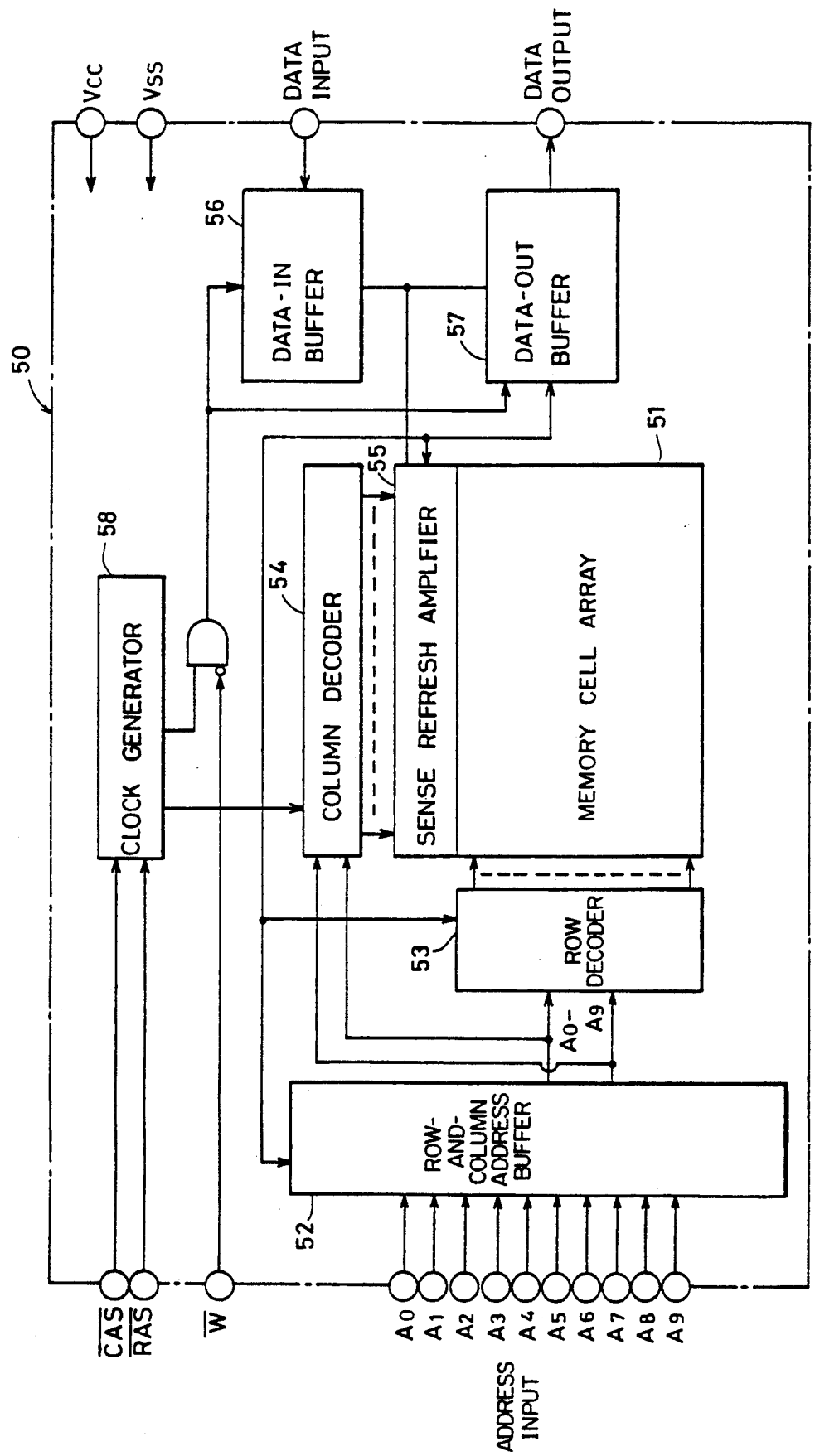
FIG. 1 is a block diagram showing a structure of a conventional DRAM.
Figure 2:
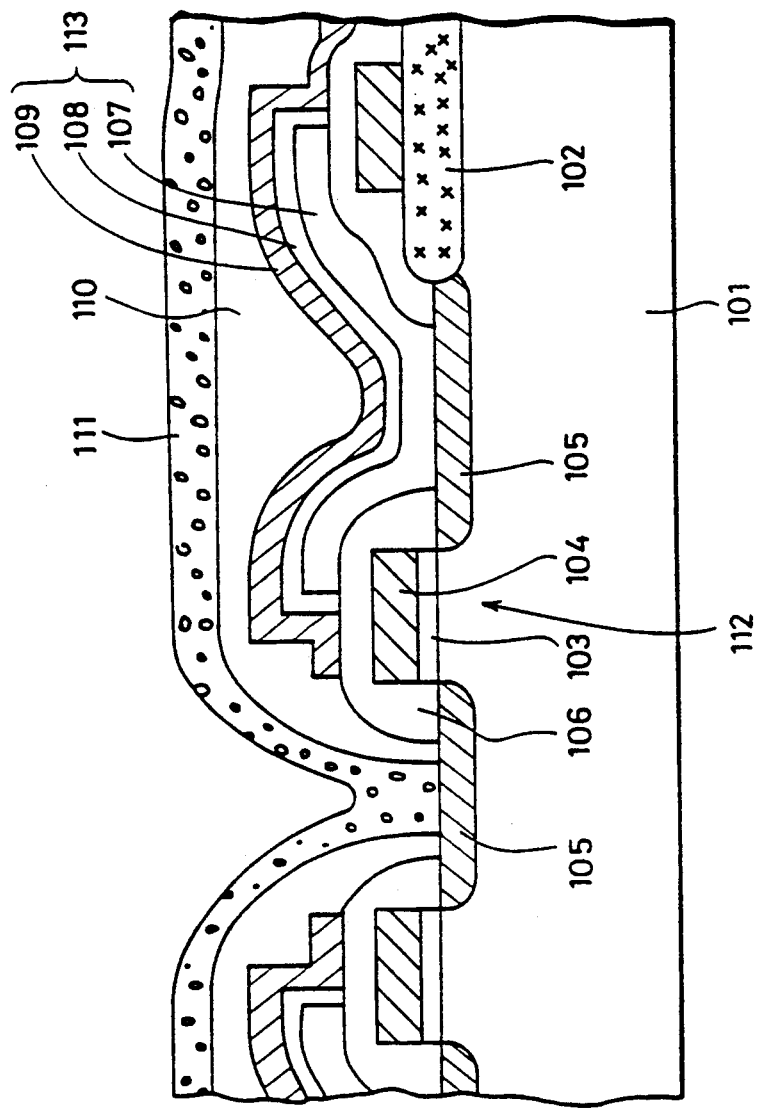
FIG. 2 is a sectional view of a memory cell of a conventional stacked type DRAM.
Figure 3:
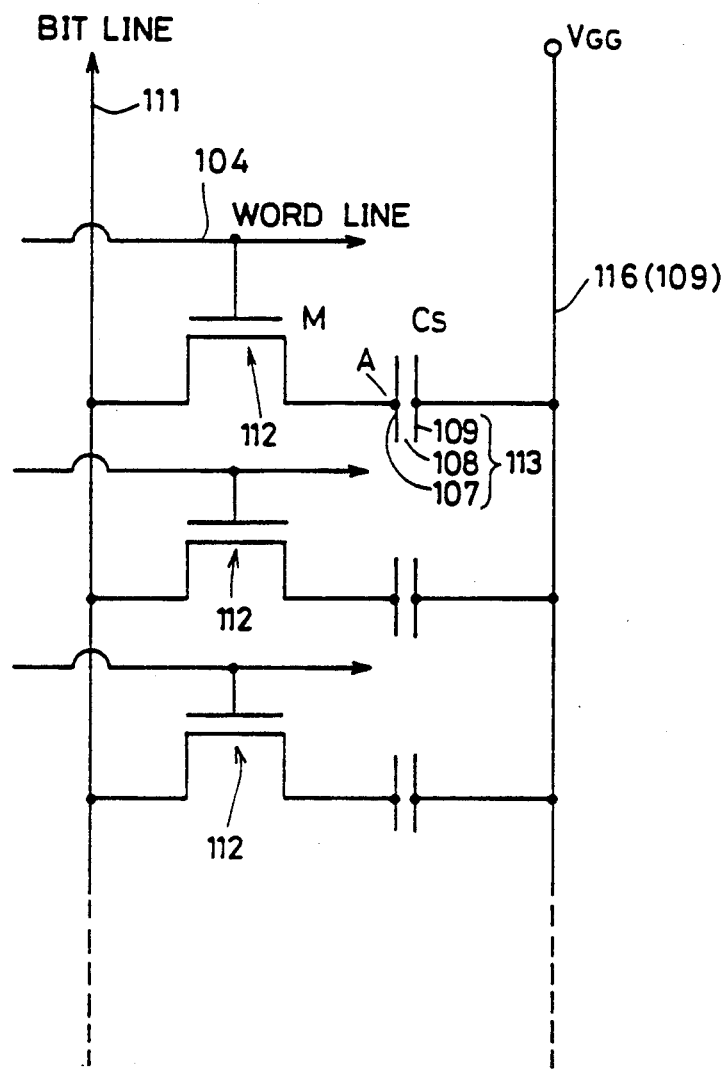
FIG. 3 is an equivalent circuit diagram of a memory cell of a DRAM.
Figure 4:
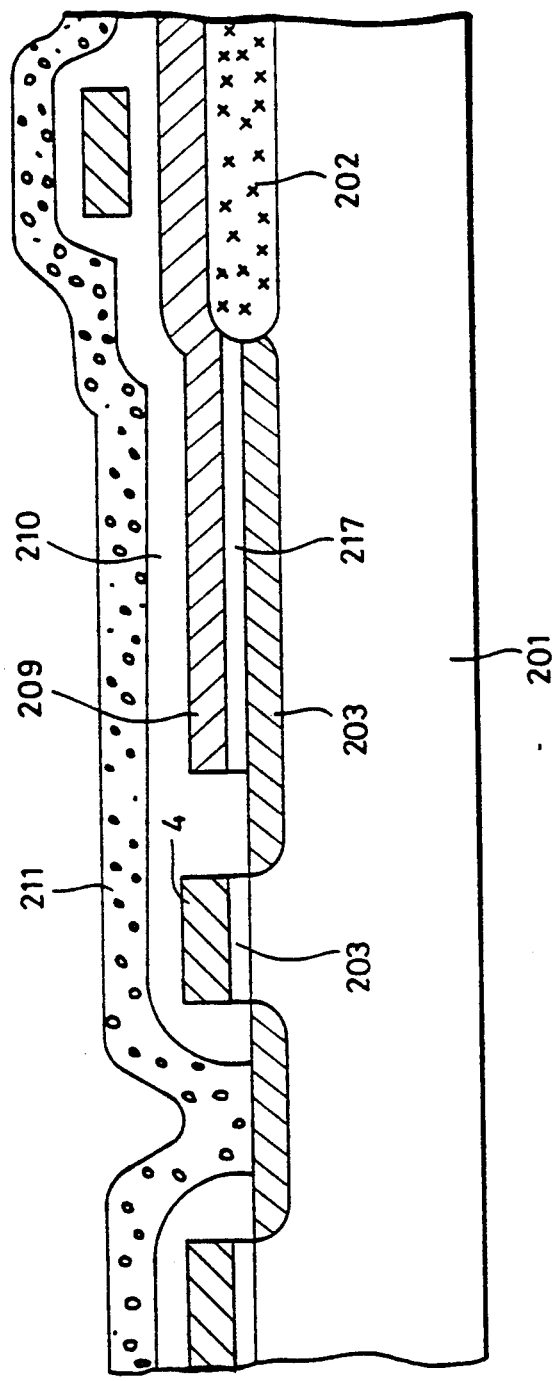
FIG. 4 is a sectional view of a memory cell of a conventional planar type DRAM.

Although the present embodiment is described in which a polysilicon stacked type DRAM cell is employed, the present invention may be applied to a trench type DRAM cell having a capacitor in a groove of a silicon substrate. In the conventional planar type DRAM cell of FIG. 4, the three layered films of $SiO_2/Si_3N_4/SiO_2$ may be employed as the dielectric film of the capacitor. In this case, the present invention is effective for setting the voltage of $V_{GG}$. This is because the physical phenomenon essential to the present invention is associated with trap formation within the insulating film, as described with reference to FIGS. 6B and 6C.

In the semiconductor device of the present invention, a fixed voltage greater than 0 and less than an arithmetic average of high logic voltage $V_H$ and low logic voltage $V_L$ is applied from a fixed voltage generator to a second electrode of a capacitor comprising first and second electrodes arranged opposing each other and a multilayer dielectric film formed between these electrodes. As a result, a fixed voltage suitable to the lifetime characteristic of the multilayer dielectric film is applied to the second electrode of the capacitor to improve significantly the lifetime of the capacitor dielectric film. This results in improvement in the reliability of the capacitor dielectric film.

The method of controlling a semiconductor device of the present invention comprises the steps of applying alternately high logic voltage $V_H$ and low logic voltage $V_L$ to the first electrode of the capacitor at the time of operation of a semiconductor device comprising first and second electrodes arranged opposing each other and a multilayer dielectric film formed between these electrodes, and applying a fixed voltage $V_{GG}$ set greater than 0 and lower than an arithmetic average of high logic voltage $V_H$ and low logic voltage $V_L$ to the second electrode. Therefore, a fixed voltage suitable to the lifetime characteristic of the multilayer dielectric film is applied to the second electrode of the capacitor. As a result, the lifetime of the dielectric film of the capacitor is improved significantly to improve the reliability of the capacitor dielectric film formed of ON (Oxidized Nitride) film.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a storage capacitor for storing a high logic level voltage VH and a low logic level voltage VL of a logic signal, said storage capacitor having first and second plates separated by a multilayer dielectric film, said first plate connected for receiving at said first plate said logic signal having said high and low logic level voltages, and
   a fixed potential generator connected to said second plate for applying to said second plate a fixed voltage VGG greater than zero and less than an arithmetic average of VL and VH,
   wherein VGG is within a voltage range expressed by:

$$0.65(VH-VL) - 1.3 \geq VGG \geq 0.65(VH-VL) - 2.5.$$

2. The semiconductor device according to claim 1, wherein said low logic level voltage is nominally zero volts, said fixed voltage is nominally within a range of 0.75 to 1.95 volts, and said high logic level voltage VH is nominally 5 volts.

3. The semiconductor device according to claim 2, wherein said low logic level voltage is nominally zero volts, said fixed voltage is nominally within a range of 0.9 to 1.3 volts and said high logic level voltage VH is nominally 5 volts.

4. The semiconductor device according to claim 1, wherein said multilayer dielectric film comprises a silicon nitride film formed on said first plate and a silicon oxide film covering said silicon nitride film on a side opposite said first plate.

5. A method of controlling a semiconductor device comprising a capacitor having first and second electrodes separated by a multilayer dielectric film,
   wherein said method comprises the steps of applying high and low voltages VH and VL alternated to said first electrode at the time of operation, and applying a fixed voltage VGG greater than zero and less than an arithmetic average of said high voltage VH and said low voltage VL to said second electrode,
   wherein said fixed voltage VGG is set within a voltage range expressed by:

$$0.65(VH-VL) - 1.3 \geq VGG \geq 0.65(VH-VL) - 2.5.$$

6. A method of selectively storing a high logic level signal VH and a low logic level signal VL in a storage capacitor having first and second plates separated by a multilayer dielectric film, comprising the steps of:
   applying a fixed voltage VGG to said second plate, and
   applying selectively said high logic level signal VH and said low logic level signal VL to said first plate wherein VGG is greater than zero and less than an arithmetic average of VL and VH, whereby corresponding charges are stored in said capacitor respectively representing high and low logic level signals,
   wherein VGG is within a voltage range expressed by:

$$0.65(VH-VL) - 1.3 \geq VGG \geq 0.65(VH-VL) - 2.5.$$

7. The semiconductor device according to claim 6, wherein said low logic level voltage VL is nominally zero volts, said fixed voltage is nominally within a range of 0.75 to 1.95 volts, and said high logic level signal VH is nominally 5 volts.

8. The semiconductor device according to claim 7, wherein said low logic level voltage is nominally zero volts, said fixed voltage is nominally within a range of 0.9 to 1.3 volts and said high logic level voltage VH is nominally 5 volts.

9. The semiconductor device according to claim 6, wherein said multilayer dielectric film comprises a silicon nitride film formed on said first plate and a silicon oxide film covering said silicon nitride film on a side opposite said first plate.

10. A method of operating a semiconductor device, said device including a plurality of word lines, a plurality of bit lines arranged crossing said word lines forming a matrix, and
    a plurality of memory cells arranged at crossings of the word lines and the bit lines, each of said memory cells including a storage capacitor for storing a high logic level voltage VH and a low logic level voltage VL of a logic signal, said storage capacitor having first and second plates separated by a multilayer dielectric film, said first plate connected to a switched terminal of a semiconductor switching element for receiving at said first plate said logic signal having said high and low logic level voltages, said method including the steps of:
    applying a non-zero fixed voltage VGG to said second plate which is less than an arithmetic average of said high and low logic level voltages VH and VL,
    selectively applying one of said high logic level voltage VH and said low logic level voltage VL to one of said bit lines,
    applying a row selecting voltage to one of said word lines, and
    in response to said row selecting voltage, connecting a respective capacitor of one of said memory cells to said respective one of said bit lines for receiving said selectively applied one of said high and low logic level voltages VH and VL, wherein VGG is within a voltage range expressed by:

$$0.65\,(VH-VL)-1.3 \geq VGG \geq 0.65\,(VH-VL)-2.5.$$

11. The semiconductor device according to claim 10, wherein said low logic level voltage VL is nominally zero volts, said fixed voltage is nominally within a range of 0.75 to 1.95 volts, and said high logic level voltage VH is nominally 5 volts.

12. The semiconductor device according to claim 11, wherein said low logic level voltage is nominally zero volts, said fixed voltage is nominally within a range of 0.9 to 1.3 volts and said high logic level voltage VH is nominally 5 volts.

13. The semiconductor device according to claim 10, wherein said multilayer dielectric film comprises a silicon nitride film formed on said first plate and a silicon oxide film covering said silicon nitride film on a side opposite said first plate.

14. A semiconductor device comprising:
a storage capacitor for storing a high logic level voltage VH and a low logic level voltage VL of a logic signal, said storage capacitor having first and second plates separated by a multilayer dielectric film, said first plate connected for receiving at said first plate said logic signal having said high and low logic level voltages, and
a fixed potential generator connected to said second plate for applying to said second plate a fixed voltage VGG greater than zero and less than an arithmetic average of VL and VH, wherein said first and second plates are formed of the same material.

15. In a method of controlling a semiconductor device comprising a capacitor having first and second electrodes separated by a multilayer dielectric film, wherein said first and second electrodes are formed of the same material, the improvement comprising increasing reliability of the multilayer dielectric film by performing the steps of:
applying high and low voltages VH and VL alternately to said first electrode at the time of operation, and applying a fixed voltage VGG greater than zero and less than an arithmetic average of said high voltage VH and said low voltage VL to said second electrode.

16. In a method of selectively storing a high logic level signal VH and a low logic level signal VL in a storage capacitor having first and second plates separated by a multilayer dielectric film, wherein said first and second plates are formed of the same material, the improvement comprising increasing reliability of the multilayer dielectric film by performing the steps of:
applying a fixed voltage VGG to said second plate, and
applying selectively said high logic level signal VH and said low logic level signal VL to said first plate wherein VGG is greater than zero and less than an arithmetic average of VL and VH, whereby corresponding charges are stored in said capacitor respectively representing high and low logic level signals.

17. In a method of operating a semiconductor device, said device including a plurality of word lines, a plurality of bit lines arranged crossing said word lines forming a matrix, and a plurality of memory cells arranged at crossings of the word lines and the bit lines, each of said memory cells including a storage capacitor for storing a high logic level voltage VH and a low logic level voltage VL, said storage capacitor having first and second plates separated by a multilayer dielectric film, wherein said first and second plates are formed of the same material, said first plate connected to a second switched terminal of said semiconductor switching element for receiving at said first plate a logic signal having said high and low logic level voltages, the improvement comprising increasing reliability of the multilayer dielectric film by performing the steps of:
applying a non-zero fixed voltage VGG to said second plate which is less than an arithmetic average of said high and low logic level voltages VH and VL,
selectively applying one of said high logic level voltage VH and said low logic level voltage VL to one of said bit lines,
applying a row selecting voltage to one of said word lines, and
in response to said row selecting voltage, connecting a respective capacitor of one of said memory cells to said respective one of said bit lines for receiving said selectively applied one of said high and low logic level voltages VH and VL.

18. The semiconductor device according to claim 14, wherein VGG is within a voltage range expressed by:

$$0.65\,(VH-VL)-1.3 \geq VGG \geq 0.65\,(VH-VL)-2.5.$$

19. The semiconductor device according to claim 14, wherein said low logic level voltage is nominally zero volts, said fixed voltage is nominally within a range of 0.75 to 1.95 volts, and said high logic level voltage VH is nominally 5 volts.

20. The semiconductor device according to claim 1, further comprising:
a plurality of said storage capacitors;
a plurality of word lines;
a plurality of bit lines crossing said word lines forming a matrix;
a plurality of memory cells arranged at crossings of the word lines and the bit lines, each of said memory cells including
(i) a semiconductor switching element responsive to a selection signal for selecting one of said memory cells having a first switched terminal connected to one of said bit lines and a control terminal connected to one of said word lines, and
(ii) one of said plurality of storage capacitors having a respective one of said first plates connected to a second switched terminal of said semiconductor switching element for receiving said logic signal at said respective first plate thereof.

21. The semiconductor device according to claim 20, wherein said low logic level voltage VL is nominally zero volts, said fixed voltage is nominally within a range of 0.75 to 1.95 volts, and said high logic level voltage VH is nominally 5 volts.

22. The semiconductor device according to claim 21, wherein said low logic level voltage is nominally zero volts, said fixed voltage is nominally within a range of 0.9 to 1.3 volts and said high logic level voltage VH is nominally 5 volts.

23. The semiconductor device according to claim 20, wherein said multilayer dielectric film comprises a silicon nitride film formed on said first plate and a silicon oxide film covering said silicon nitride film on a side opposite said first plate.

* * * * *